United States Patent [19]

Embree

[11] Patent Number: 5,689,211
[45] Date of Patent: Nov. 18, 1997

[54] QUIESCENT CURRENT CONTROL FOR THE OUTPUT STAGE OF AN AMPLIFIER

[75] Inventor: Milton Luther Embree, Muhlenberg Township, Berks County, Pa.

[73] Assignee: Lucent Technologies Inc., Murray Hill, N.J.

[21] Appl. No.: 601,414

[22] Filed: Feb. 14, 1996

[51] Int. Cl.$^6$ ................................. H03F 3/26
[52] U.S. Cl. ................................. 330/266; 330/267
[58] Field of Search .................... 330/263, 264, 330/266, 267, 268

[56] References Cited

U.S. PATENT DOCUMENTS

| | | | |
|---|---|---|---|
| 4,542,348 | 9/1985 | Lucas et al. | 330/253 |
| 4,922,208 | 5/1990 | Susak et al. | 330/255 |
| 5,337,012 | 8/1994 | Dijkmans | 330/266 |

FOREIGN PATENT DOCUMENTS

| | | | |
|---|---|---|---|
| 0317015 | 11/1988 | Netherlands | H03F 3/30 |
| 2 224 990 A | 5/1990 | United Kingdom | H03F 3/30 |

*Primary Examiner*—Steven Mottola
*Attorney, Agent, or Firm*—John M. Harman

[57] ABSTRACT

The invention is an amplifier such as an operational amplifier having an output stage with a reduced quiescent current control transistor device area that provides sufficient quiescent current control for proper operation thereof. The output stage includes a current diverter or diverting arrangement whereby current flowing to the quiescent current control transistor area is reduced by diversion without jeopardizing the proper operation of the operational amplifier. In this manner, the relative size of the quiescent current control transistors can be significantly reduced without sacrificing any of the overall performance of the amplifier.

14 Claims, 5 Drawing Sheets

1

QUIESCENT CURRENT CONTROL FOR THE OUTPUT STAGE OF AN AMPLIFIER

BACKGROUND OF THE INVENTION

1. Field of the Invention

The invention relates to amplifier circuitry. More particularly, the invention relates to the design of an output stage for amplifiers including operational amplifiers.

2. Description of the Related Art

Many conventional amplifier output stages feature a pair of control transistors coupled to a corresponding pair of output drive transistors, which are generally referred to as the positive and negative drivers. Circuits in operational amplifier output stages must be designed to maintain a small quiescent current from the positive supply through the positive and negative drivers to the negative supply in order to prevent excessive cross-over distortion. This must be accomplished with a reasonable tolerance (e.g., between a 100-to-1 and a 1000-to-1 ratio between the maximum drive current and quiescent current of the circuit) over a wide temperature range.

Quiescent current, in general, is the total operational amplifier current under quiescent or no-load conditions. It is crucial to maintain proper quiescent current control within an operational amplifier for adequate performance and appropriate signal response.

FIGS. 1 and 2 show schematic representations of conventional operational amplifier output stage circuit designs in bipolar and MOS (metal oxide semiconductor) technologies. In these Figures and in the description below, bipolar transistors are referenced by the letter Q, MOS transistors such as double diffused metal oxide-semiconductor (DMOS) transistors and insulated-gate field-effect transistors (IGFETs) are referenced by the letter M, and resistors are referenced by the letter R. Also, in the description of conventional devices below, corresponding components in both the bipolar and MOS versions are referred to by the same reference numerals.

Also, for all IGFETs having approximately the same channel length, a multiplicative factor of their respective channel width (in microns) between material junctions is given for comparative purposes and to aid appropriate selection of devices by those skilled in the art. For example, in FIG. 2, the P-channel IGFET M1 (×100) has a channel width factor of ×100, which means that the performance characteristics of IGFET M1 are equivalent to approximately 100 P-channel IGFET M4 (×1) transistors in parallel. For purposes of discussion herein, such multiplicative factors are referred to as characteristic size. Similar characteristic size arrangements also exist for the bipolar and DMOS transistors shown and described herein. Comparisons of transistor devices in this manner are known to those skilled in the art.

In general, devices with larger emitter areas (bipolar) or channel widths (MOS) and thus having larger characteristic sizes are physically larger, but such relationship is not always proportional. Therefore, for purposes of discussion in this description, any comparative reference to the size of one or more bipolar or MOS transistors (e.g., ×1, ×10 or ×100) refers to the emitter area factor or channel width factor, respectively, of the device compared to like devices having approximately the same emitter design or channel length, respectively, (which is assumed to be the case herein) and not necessarily the physical size thereof.

In FIG. 1, a schematic diagram of a conventional bipolar operational amplifier output stage is shown. The arrangement uses a complementary emitter output configuration in which a pair of diode-connected control transistors, Q1 and Q2, is coupled to a corresponding pair of output drive transistors, Q4 and Q5.

Typically, a bipolar complementary output configuration is characterized by a bipolar NPN output drive transistor in conjunction with a bipolar PNP output drive transistor. An emitter output configuration is a known arrangement formed by combining a bipolar PNP output drive transistor with a bipolar NPN output drive transistor such that the emitter of each device is operably connected to the output terminal of the operational amplifier.

Referring to FIG. 1, there is shown a conventional operational amplifier 10 having an output stage 12. Also, operational amplifier 10 has a first stage 14 with an inverting input 16, a noninverting input 18 and an output 22. First stage 14 is connected to a positive rail or source voltage 24 and a negative rail or source voltage 26. For purposes of discussion in this description, first stage 14 represents generally the stages of a conventional operational amplifier not shown in FIG. 1, e.g., the input stage and the bias stage.

A constant current source 32, e.g., 100 µA, is connected between positive source voltage 24 and a first node 41. An NPN bipolar transistor Q3 connects as shown between negative source voltage 26, output 22 from first stage 14 and a second node 42. Both transistor Q3 and current source 32 are thought of conventionally as part of a second stage that exists between the input and output stages of operational amplifiers and thus, for purposes of discussion herein, are not considered part of either first stage 14 or output stage 12. Conventionally, Q3 is referred to as the second stage amplifier transistor.

In output stage 12 of operational amplifier 10, a pair of quiescent current control transistors, such as a diode-connected PNP bipolar transistor Q1 (×100) and a diode-connected NPN bipolar transistor Q2 (×100), are connected together between nodes 41 and 42 as shown. Specifically, the emitter of Q1 is connected to node 41 and the base and collector of Q1 are connected to the base and collector of Q2. The emitter of Q2 is connected to node 42 and thus is in operable connection with the collector of Q3.

Also connected to node 42 is the base of an output drive transistor, e.g., PNP transistor Q5 (×100). The emitter of Q5 is connected directly to an output terminal 36 of operational amplifier 10 via a node 43 and the collector of Q5 connects to negative source voltage 26. Conventionally, Q5 is referred to as the negative output driver.

Operational amplifier 10 has another (positive) output driver, e.g., an NPN transistor Q4 (×100). The collector of Q4 connects to positive source voltage 24 and the emitter connects to output terminal 36 via node 43. The base of Q4 is connected to node 41, which, as mentioned previously, connects to both constant current source 32 and the emitter of diode-connected PNP transistor Q1.

In general, quiescent current control transistors Q1 and Q2 collectively constitute the input or control side of output stage 12. Similarly, positive output driver Q4 and negative output driver Q5 collectively constitute the output side of output stage 12.

In operation of the circuit of FIG. 1, it can be seen by inspection to one skilled in the art that with current source 32 being approximately 100 µA, there will be approximately 100 µA flowing through Q1 and Q2. Also, if Q1 and Q5 are equivalent (i.e., the same characteristic size and transistor type) and if Q2 and Q4 are equivalent, the quiescent current in output drive transistors Q4 and Q5 is constant, at approximately 100 μA, at all temperatures. Thus, desired operating and performance requirements are met.

However, in this basic arrangement, each control transistor Q1 and Q2 must be the same characteristic size as each output drive transistor Q4 and Q5 (e.g., ×100) for proper operation. Such requirement is undesirable from a manufacturing perspective in terms of overall physical size, cost and the like.

Existing techniques to overcome this problem include circuit "tricks" such as connecting a resistor (not shown) having an approximate value of 1.2 kΩ (1200 ohms) between the common base-collector connection of Q1 (i.e., between nodes 44 and 45) and rearranging Q2 so that its base and collector are connected to nodes 44 and 45, respectively. This modification results in a reduction of the voltage potential between the base of Q4 and the base of Q5 by approximately 120 mV.

It should be noted that 60 mV represents approximately 1 order of magnitude in bipolar transistor technology. Therefore, a change of 60 mV across the base-emitter junction of a bipolar transistor results in a proportional collector current change of 1 order of magnitude or, alternatively, a proportional change in transistor size of 1 order of magnitude. In this manner, a 120 mV drop across the base connections of Q4 and Q5 allows both Q1 and Q2 (60 mV for Q1 and 60 mV for Q2) to be 1 order of magnitude smaller (i.e., ×10) than output drive transistors Q4 and Q5.

However, the circuit "trick" just described has significant temperature problems and the positive feedback nature of the circuit makes it susceptible to instability. In fact, many circuit "tricks" such as this cause the quiescent current to become significantly dependent on temperature and manufacturing variations, which is undesirable.

Similar problems exist in the MOS environment with the MOS version of the circuit of FIG. 1. FIG. 2 shows such an output circuit using a quasi-complementary, source output arrangement to permit use of only N-channel output driver transistors. Typically, a source output configuration is formed by combining a MOS P-channel output drive transistor and a MOS N-channel output drive transistor such that the source of each device is connected to the output terminal of the operational amplifier. A source output configuration is used for stability considerations in applications where complex load impedances must be driven.

In a quasi-complementary configuration, at least one of the output drive transistors is replaced by a composite circuit whose elements collectively behave like the single output drive transistor of interest. Typically, due to difficulties in manufacturing monolithically compatible P-channel DMOS transistors, a composite circuit having only N-channel DMOS transistors is used as the P-channel drive transistor.

Referring to FIG. 2, there is shown a conventional operational amplifier 10 having a quasi-complementary output stage (shown generally as 12). Operational amplifier 10 has a first stage 14 with an inverting input 16, a noninverting input 18 and an output 22. First stage 14 is connected to a positive source voltage 24 and a negative source voltage 26. For purposes of discussion in this description, first stage 14 represents generally all stages of a conventional operational amplifier but its second and output stages, i.e., the input stage, the bias stage and the compensation stage.

A constant current source 32, e.g., 100 μA, is connected between positive source voltage 24 and a node 41. An N-channel DMOS transistor M3 is connected as shown between negative source voltage 26, first stage output 22 and a node 42. Typically, both current source 32 and DMOS transistor M3 are viewed as part of a second stage that exists between the input and output stages of operational amplifiers and thus, for purposes of discussion herein, are not considered part of either first stage 14 or output stage 12. Often, M3 is referred to as the second stage amplifier transistor.

In output stage 12 of operational amplifier 10, a pair of quiescent current control transistors, such as a diode-connected P-channel IGFET M1 (×100) and a diode-connected N-channel DMOS transistor M2 (×100), are connected between nodes 41 and 42 as shown. Specifically, the source of IGFET M1 is connected to node 41 and the gate and drain are connected to the gate and drain of DMOS transistor M2. The source of DMOS transistor M2 is connected to node 42 and thus is connected to the drain of DMOS transistor M3.

Also connected to node 42 is an output drive transistor or equivalent circuit, e.g., the composite circuit formed by P-channel IGFET M4 (×1), N-channel DMOS transistor M5 (×1) and N-channel DMOS transistor M7 (×100). As shown in FIG. 2, node 42 is connected to the gate of the high voltage, P-channel IGFET M4 (×1), whose source connects to an output terminal 36 of operational amplifier 10 via a node 43. The drain of M4 connects to the gate and drain of the diode-connected N-channel DMOS transistor M5. The source of DMOS transistor M5 is connected directly to negative source voltage 26.

Connected between positive source voltage 24 and output terminal 36 is the positive output driver, e.g., an N-channel DMOS transistor M6 (×100). As shown, the drain of DMOS transistor M6 is connected to positive source voltage 24, the gate of DMOS transistor M6 connects to node 41 and the source of DMOS transistor M6 connects with output terminal 36 via node 43.

The final component in operational amplifier 10 is the N-channel DMOS transistor M7 (×100), which is coupled to DMOS transistor M5 whereby the gate of DMOS transistor M7 is connected to the gate and drain of DMOS transistor M5, which, as mentioned previously, is also connected to the drain of P-channel IGFET M4. The drain of DMOS transistor M7 is connected to output terminal 36 via node 43 and the source of DMOS transistor M7 is connected directly to negative source voltage 26.

As mentioned previously, M4, M5 and M7 collectively form a composite drive circuit (shown as 38) that functions as a P-channel DMOS with its source connected to output terminal 36, its drain connected to the negative source voltage 26, and its gate connected to node 42. In this manner, composite circuit 38 combines with DMOS transistor M6 to satisfy the source output configuration requirement for stability, as discussed previously.

Similar to the corresponding bipolar version shown in FIG. 1, in operation of the circuit shown in FIG. 2, by inspection it is clear to one skilled in the art that if M1 (×100) is 100 times larger than M4 (×1), then their gate-to-source voltages will be equal when the current through M1 is 100 times greater than the current through M4. The amplifying current mirror formed by M5 (×1) and M7 (×100) causes the current through M7 to be 100 times greater than the current through M4. Also, if M2 (×100) is equivalent to M6 (×100), their gate-to-source voltages will be equal when their currents are equal. If such conditions exist, the voltage loop equation around M1, M2, M4 and M6 is satisfied when the drain currents of M6 and M7 are approximately equal to current source 32. However, as in the case of the bipolar circuit of FIG. 1, for proper operation, the sizes of M1 and M2 will have to be as large as output drive transistors M6 and M7. As mentioned previously, such transistor sizing is a problem from a manufacturing perspective.

In some MOS operational amplifier circuits, a simple resistor biasing scheme (not shown) is used in an attempt to overcome this problem. That is, devices M1 and M2 are replaced by a resistor of suitable resistance and connected between nodes 41 and 42 or, alternatively, devices M1 and M2 are removed and nodes 41 and 42 are shorted together. However, both arrangements result in relatively large crossover distortion, which clearly is undesirable.

In view of the foregoing, it will be appreciated that there exists in the art the need for an amplifier output stage, with manageably sized control transistors, that has adequate quiescent current control yet does not suffer from the performance problems mentioned above.

SUMMARY OF THE INVENTION

According to its major aspects and broadly stated, the invention is an amplifier with an improved output stage. In particular, it is an operational amplifier having an output stage with a reduced quiescent current control transistor device area that provides sufficient quiescent current control for proper amplifier operation. The output stage includes a current diverter or diverting arrangement whereby current flowing to the quiescent current control transistor area is reduced by diversion without jeopardizing the proper operation of the operational amplifier. In this manner, the relative size of the quiescent current control transistors can be significantly reduced without sacrificing any of the overall performance of the operational amplifier.

DETAILED DESCRIPTION

Figure 1:
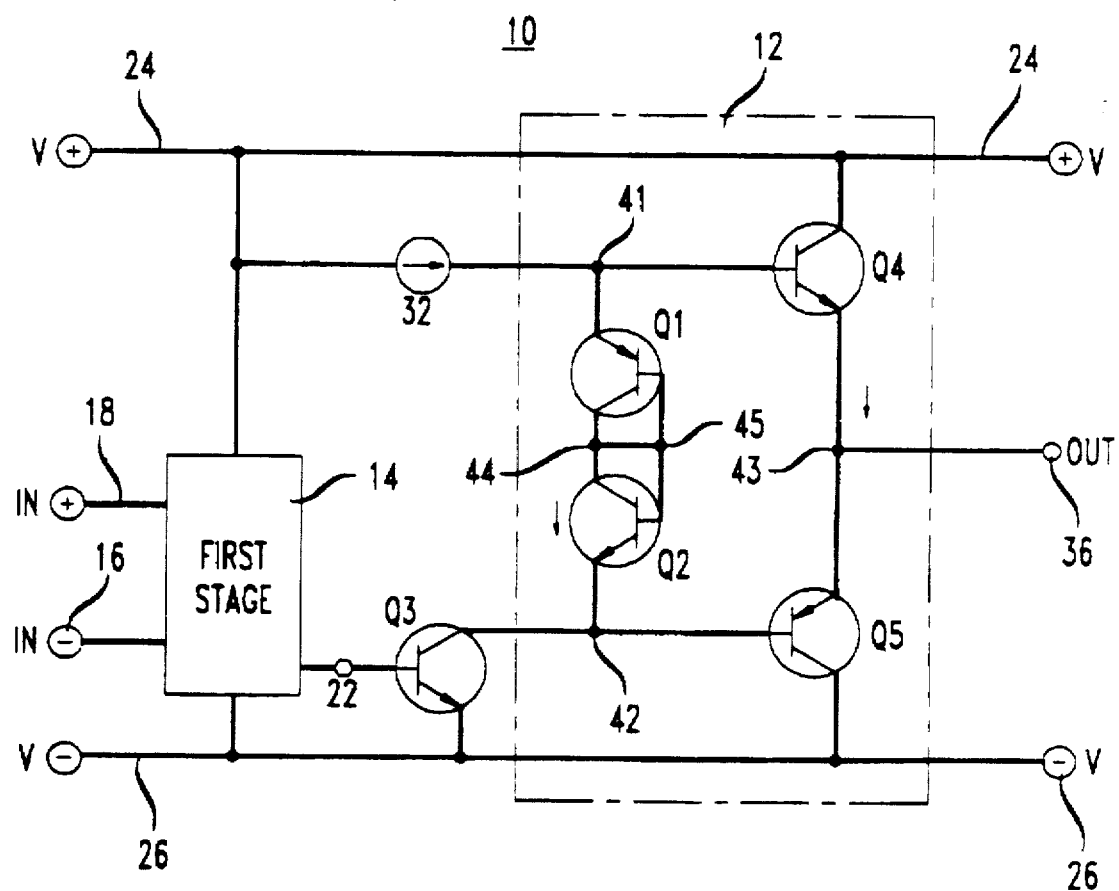
FIG. 1 is a schematic diagram of a conventional bipolar operational amplifier output stage.

In the following description similar components in both the bipolar and MOS versions are referred to by the same reference numeral to maintain consistency in the drawings and throughout the description. As stated previously, for purposes of discussion in this description, any comparative reference denoted herein, e.g., as ×1, ×10, ×100 and the like, refers to the characteristic sizes of the respective MOS devices among those of the same type and having approximately the same channel length, or of the respective bipolar devices having the same number of equivalent sized emitters. As mentioned previously, comparisons of transistor devices in this manner are known to those skilled in the art.

Figure 3:
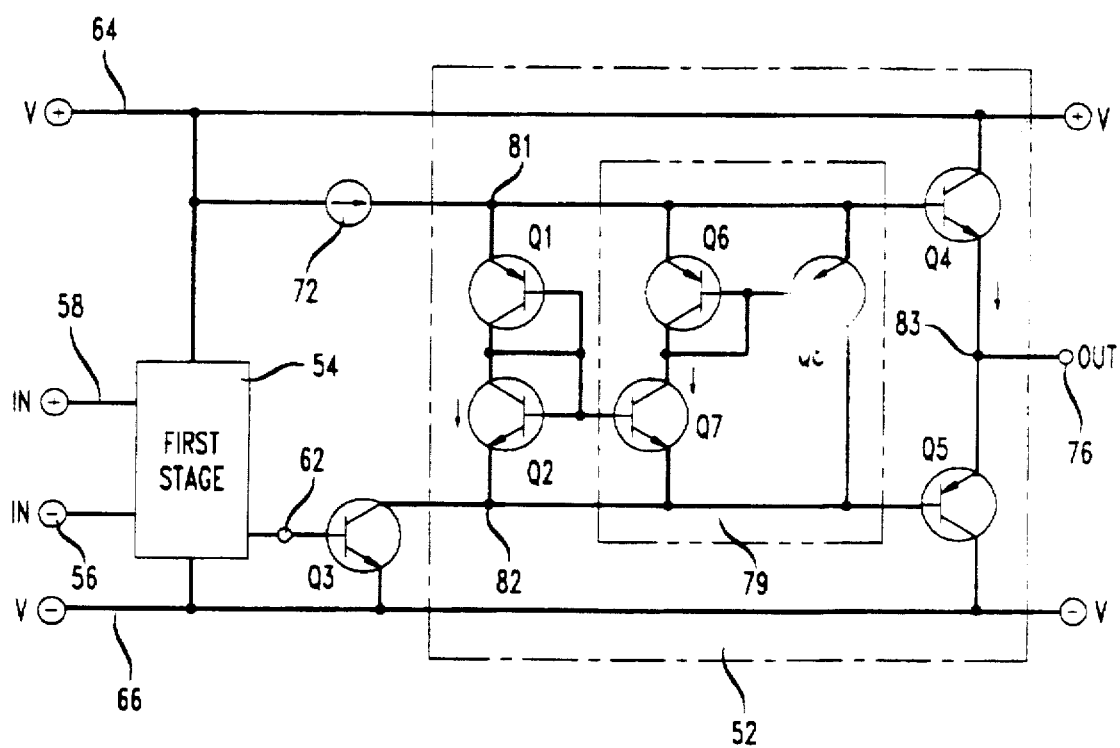
FIG. 3 is a schematic diagram of a bipolar operational amplifier output stage according to an embodiment of the invention.

In FIG. 3, there is shown an operational amplifier 50 having a complementary emitter output configuration output stage (shown generally as 52) according to an embodiment of the invention. Operational amplifier 50 has a first stage 54 with an inverting input terminal 56, a noninverting terminal 58 and an output terminal 62. Also, first stage 54 is connected to a positive source voltage or rail 64 and a negative source voltage or rail 66. For purposes of discussion in this description, first stage 54 represents generally all stages of a conventional operational amplifier not shown in FIG. 3 except the second and output stages, e.g., the compensation stage and the bias stage. Furthermore, it will be understood that, except for the novel output stage of operational amplifier 50, operational amplifiers according to the invention can have conventional structure.

A current source 72 is connected between positive source voltage 64 and a node 81. An NPN bipolar transistor Q3 is connected between negative source voltage 66, output terminal 62 of first stage 54 and a node 82. Both current source 72 and transistor Q3 are considered to be pan of a second stage that exists between the input and output stages of operational amplifiers and thus, for purposes of discussion herein, are not considered to be pan of either output stage 52 or first stage 54. Conventionally, Q3 is referred to as the second stage amplifier transistor.

In output stage 52 of operational amplifier 50, quiescent current control transistors, such as a diode-connected PNP bipolar transistor Q1 (×1) and a diode-connected NPN bipolar transistor Q2 (×1), are operably connected between nodes 81 and 82 as shown. For example, the emitter of Q1 is connected to node 81 and the base and collector of Q1 are connected to the base and collector of Q2. Also, the emitter of Q2 is connected to node 82 and thus is in operable connection with the collector of second stage amplifier Q3.

Also connected to node 82 is the base of a negative output driver, such as a PNP transistor Q5 (×100), whose emitter is connected to an output terminal 76 of operational amplifier 10 via a node 83. The collector of Q5 connects directly to negative source voltage 66.

A positive output driver, such as an NPN transistor Q4 (×100), is connected between positive source voltage 64 and output terminal 76, as shown. The base of Q4 is operably connected to node 81, which, as mentioned previously, is connected to current source 72 and the emitter of diode-connected PNP Q1. The emitter connects to output terminal 76 via node 83 and the collector of Q4 connects directly to positive source voltage 64.

For purposes of discussion in this description, quiescent current control transistors Q1 and Q2 collectively constitute the input or control side of output stage 52. Similarly, output drivers Q4 and Q5 collectively constitute the output side of output stage 52.

The inventive portion of the circuit, which will be described in greater detail below, overcomes the problems associated with conventional operational amplifiers generally by diverting second stage current away from quiescent current control transistors Q1 and Q2. For purposes of discussion in this description, the term "diverter" or "current diverter" is intended to encompass any suitable device or arrangement of devices that reduces the current flowing through devices such as the control transistors, in a manner that is without undesirable operational amplifier operating or performance effects. It is also to be understood that the current flow is reduced by diverting or redirecting current around key devices such as the quiescent current control transistors.

In one embodiment of the invention, the diverter includes a current amplifying transistor coupled with a current mirror arrangement that is operably connected between the control side and the output side of output stage 52. For example, the current amplifying transistor is connected to the control transistors in a manner that forms a first current mirror arrangement. Thus, the first current mirror arrangement is coupled to the current mirror arrangement existing as part of the diverter.

A current mirror arrangement is a well known biasing technique in which a first diode-connected transistor is connected across the base-emitter junction of a second amplifying transistor. In this arrangement, if the transistors are similar and if the base-emitter voltages of both transistors are effectively equal, then the collector currents through the transistors are also approximately equal.

In FIG. 3, one possible diverter or current diverting arrangement is shown generally as 79. An NPN amplifying transistor Q7 is connected as shown to quiescent current control transistors Q1 and Q2 whereby Q7 forms a current mirror arrangement with diode-connected quiescent current control transistor Q2. Also, the second current mirror arrangement formed by a diode-connected PNP transistor Q6 and an amplifying PNP transistor Q8 is coupled thereto as shown.

Specifically, the base of Q7 is connected to the base and collector of Q2 and the base and collector of Q1. The emitter of Q7 is connected to the emitter of Q2 and the base of negative output drive transistor Q5 via node 82. The collector of Q7 is connected to the second current mirror configuration formed by transistors Q6 and Q8, which will be described below.

The base and collector of diode-connected transistor Q6 is connected to the collector of Q7 and the base of Q8. The emitters of both Q6 and Q8 connect to node 81, which, as mentioned previously, is connected to current source 72, the emitter of Q1 and the base of positive output drive transistor Q4. The collector of Q8 connects to the base of negative output drive transistor Q5, which is connected, via node 82, to the emitters of Q7 and Q2 and the collector of second stage amplifier Q3.

It should be noted here that control transistors Q1 (×1) and Q2 (×1) are each approximately 1/100th the characteristic size (i.e., 2 orders of magnitude) of their corresponding output driver transistors Q4 (×100) and Q5 (×100), compared with conventional control transistors that are substantially equal in size or at best approximately 1/5th the size of their respective output driver transistors. Also, Q7 (×9) is approximately 9 times the characteristic size of Q2 (×1), and Q8 (×10) is approximately 10 times the characteristic size of Q6 (×1). The significance of these size relationships will be discussed in greater detail below.

In operation of the arrangement shown in FIG. 3, assuming current source 72 is approximately 100 µA, both Q1 and Q2 are sized (×1) so that approximately 1 A from current source 72 flows through Q1 and Q2. The current mirror formed by Q2 and Q7 causes the current flowing through Q7 (×9) to be 9 times that of the current flowing through Q2 (×1). Thus, with 1 µA flowing through Q2, 9 µA are flowing through Q7, and consequently substantially 9 µA must be flowing through Q6 (×1).

The second current mirror formed by Q6 (×1) and Q8 (×10) causes the current flowing through Q8 to be 10 times that of the current flowing through Q6. Therefore, if 9 µA are flowing through Q6, 90 µA are flowing through Q8. As is necessarily the case, the total current flowing in the three branches (1 µA in the Q1, Q2 branch+9 µA in the Q6, Q7 branch+90 µA in the Q8 branch=100 µA) equals the current from current source 72.

To one skilled in the art, it will be clear that for a quiescent current of 100 µA to flow through output driver transistors Q4 and Q5, the characteristic sizes of Q1 and Q2 must be 100 times smaller than that of Q5 and Q4 because the current through the former is 100 times smaller (1 µA). Such requirement is necessary for Q1 and Q2 to have the same base-emitter voltages as Q5 and Q4, respectively, which is the only way the loop voltage law can be satisfied. Also, assuming that within each of the pairs of transistors Q1 and Q8, Q2 and Q4, Q2 and Q7, and Q6 and Q8, the two transistors of the pair are of the same type and structure, their temperature performances are similar and the resulting quiescent current is, to a first order, independent of temperature and manufacturing variations.

The size advantage associated with this embodiment of the invention is also clear. The two bipolar control transistors Q1 (×100) and Q2 (×100) shown in FIG. 1 are replaced in FIG. 3 by bipolar transistors Q1 (×1), Q2 (×1), Q6 (×1), Q7 (×9) and Q8 (×10). If no size efficiency function (i.e., scaling transistor performance without correspondingly varying the physical size thereof) is assumed, then the transistor size area for the quiescent current control diverter as shown in FIG. 3 and described above has improved from 200 (100+100 as shown in FIG. 1) to 22 (1+1+1+9+10) or 89%.

In the particular arrangement shown in FIG. 3, it should be noted that transistors Q6, Q7 and Q8 are sized appropriately, along with transistors Q1 and Q2, to cause a two-step increase in the current relationship between the three current flowing branches based on the relative sizes of the control transistors Q1 and Q2 and the output driver transistors Q5 and Q4. In this example, the first step increase is from 1 µA to 9 µA between the first and second branches and the second step increase is from 9 µA to 90 µA between the second and third branches. In the bipolar environment, the step increases need to be of these relatively small magnitudes because of manufacturing difficulty and physical size constraints occurring otherwise.

Figure 4:
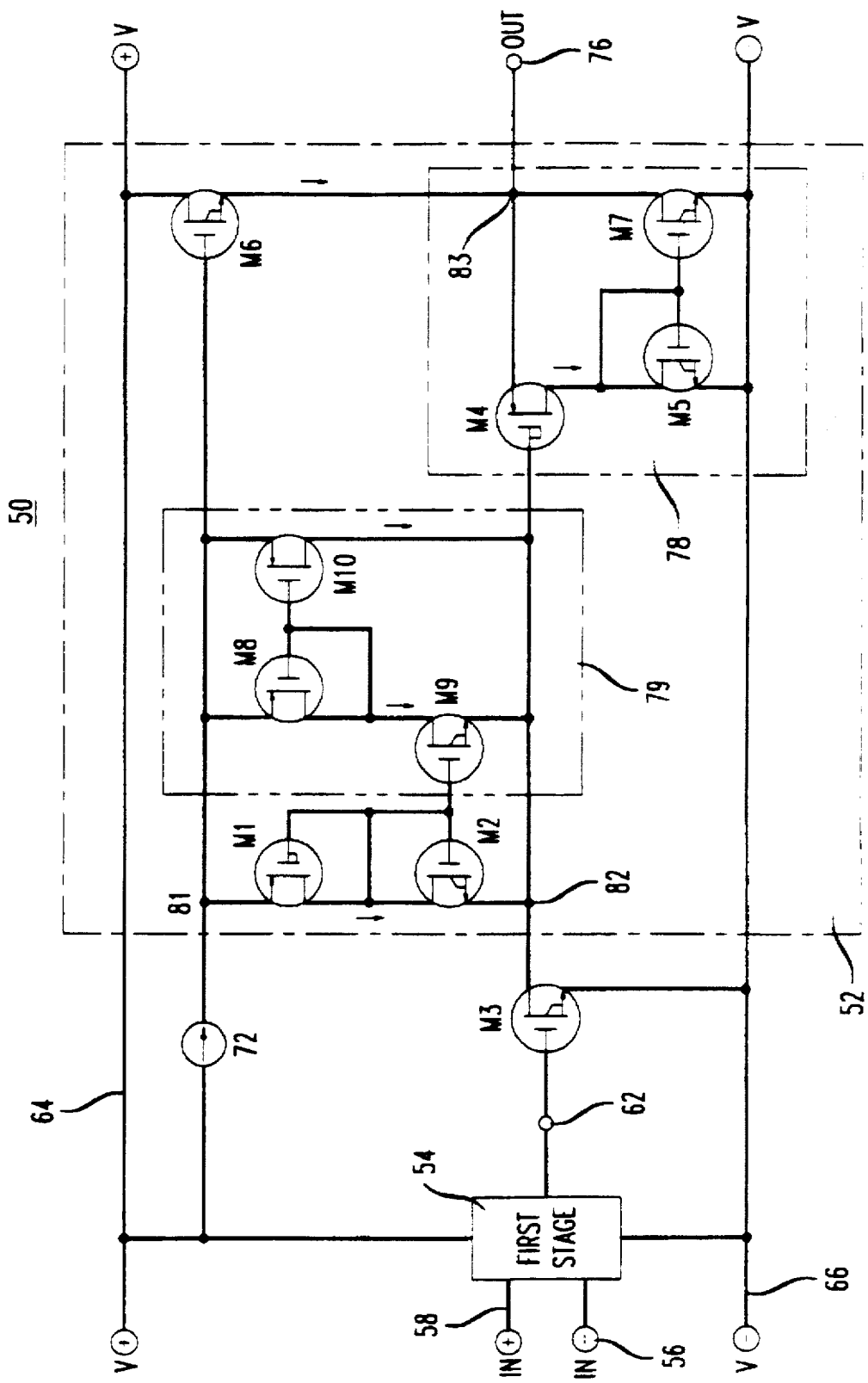
FIG. 4 is a schematic diagram of a MOS operational amplifier output stage according to an embodiment of the invention.

FIG. 4 shows a MOS version of the embodiment just described. The structure and analysis are similar. In this embodiment, operational amplifier 50 has a quasi-complementary output stage 52, a first stage 54 with an inverting input 56, a noninverting 58 and an output 62, and is connected to a positive source voltage 64 and a negative source voltage 66. As mentioned previously, it will be understood that, except for the novel output stage of operational amplifier 50, MOS operational amplifiers according to the invention can have conventional structure.

A current source 72 is connected between positive source voltage 64 and a node 81. An N-channel DMOS transistor M3 is connected between negative source voltage 66, first stage output 62 and a node 82. Both current source 72 and DMOS transistor M3 are considered to be part of a second stage that exists between the input and output stages of operational amplifiers and thus are not considered to be part of either output stage 52 or first stage 54. Conventionally, DMOS transistor M3 is referred to as the second stage amplifier transistor.

In output stage 52 of operational amplifier 50, quiescent current control transistors, such as a diode-connected P-channel IGFET M1 (×1) and a diode-connected N-channel DMOS transistor M2 (×1), are operably connected between nodes 81 and 82 as shown. For example, the source of IGFET M1 is connected to node 81 and the gate and drain of IGFET M1 are connected to the gate and drain of DMOS transistor M2. The source of M2 is connected to node 82 and thus is connected to the drain of DMOS transistor M3.

Connected to positive source voltage 64 is the drain of a positive output driver, such as an N-channel DMOS transistor M6 (×100). The gate of DMOS transistor M6 connects to node 81, which, as mentioned previously, is connected to current source 72 and to the source of diode-connected P-channel IGFET M1. The source of DMOS transistor M6 connects with output terminal 76 via node 83.

Connected between output terminal 76, negative source voltage 66 and node 82 is a negative output driver, such as the one formed by a composite circuit 78. Composite circuit 78 includes a high voltage, P-channel IGFET M4 (×1), a diode-connected N-channel DMOS transistor M5 (×1), and an N-channel DMOS transistor M7 (×100). As shown in this example, the gate of IGFET M4 is connected to node 82, the source is connected to output terminal 76 via node 83, and the drain is connected to the gate and drain of DMOS transistor M5. The source of DMOS transistor M5 is connected directly to negative source voltage 66.

DMOS transistor M7, the remaining component of composite circuit 78, is coupled to DMOS transistor M5 so that the gate of DMOS transistor M7 is connected to the gate and drain of diode-connected DMOS transistor M5, which, as mentioned previously, is also connected to the drain of P-channel IGFET M4. The drain of DMOS transistor M7 is connected to output terminal 76 via node 83 and the source of DMOS transistor M7 is connected directly to negative source voltage 66.

As is known in the art, M4, M5 and M7 collectively form a P-channel composite drive circuit 78, which, as described previously, is needed because of the relative difficulty in manufacturing P-channel DMOSs. Also, as noted previously, for purposes of discussion in this description, IGFET M1 and DMOS transistor M2 collectively constitute the input or control side of output stage 52 and the positive driver (DMOS transistor M6) and the negative driver (composite drive circuit 78) collectively constitute the output side of output stage 52.

In this MOS version of an embodiment of the invention, one possible diverter or diverting arrangement as described previously is shown generally as 79. In this arrangement, an N-channel DMOS transistor M9 is connected as shown to diode-connected control transistors IGFET M1 and DMOS transistor M2. Also, a current mirror arrangement, such as the one formed by a diode-connected P-channel IGFET M8 and an amplifying P-channel IGFET M10, is coupled to the current mirroring arrangement formed by DMOS transistor M2 and DMOS transistor M9.

For example, the gate of IGFET M9 is connected to the gate and drain of DMOS transistor M2 and the gate and drain of IGFET M1. The source of DMOS transistor M9 is connected to the source of DMOS transistor M2 and the gate of IGFET M4 via node 82. The drain of DMOS transistor M9 is connected to the second current mirror configuration formed by IGFET M8 and IGFET M10.

The gate and drain of diode-connected IGFET M8 is connected to the drain of DMOS transistor M9 and the gate of IGFET M10. The sources of IGFET M8 and IGFET M10 connect to node 81, which, as mentioned previously, connects with current source 72, the source of IGFET M1, and the gate of positive output driver transistor DMOS 30 transistor M6. The drain of IGFET M10 connects to composite circuit 78 via the gate of IGFET M4, which is connected, via node 82, to the source of DMOS transistor M2, the source of DMOS transistor M9, and the drain of second stage amplifier DMOS transistor M3.

It should be noted in this MOS version that quiescent current control transistor M1 (×1) is approximately 1/100th the size of its corresponding output driver M6 (×100), compared with the conventional quiescent current control transistor that is often equal to the size of the output driver transistor. Also, with respect to this particular embodiment of diverter 79, both IGFET M8 (×1) and IGFET M10 (×100) are low voltage devices and, in the MOS environment, low voltage devices sized ×1 and ×100 are both relatively small in physical size.

The operation of the arrangement shown in FIG. 4 is similar to the bipolar version thereof shown in FIG. 3. However, in the MOS arrangement shown in FIG. 4, the first current mirror step increase is roughly unity (×1 to ×1) while the second current mirror step increase is from 1 to 100 (×1 to ×100). Unlike bipolar arrangements of this kind, in the low voltage MOS environment, large step increases (e.g., from ×1 to ×100) are practical.

Figure 2:
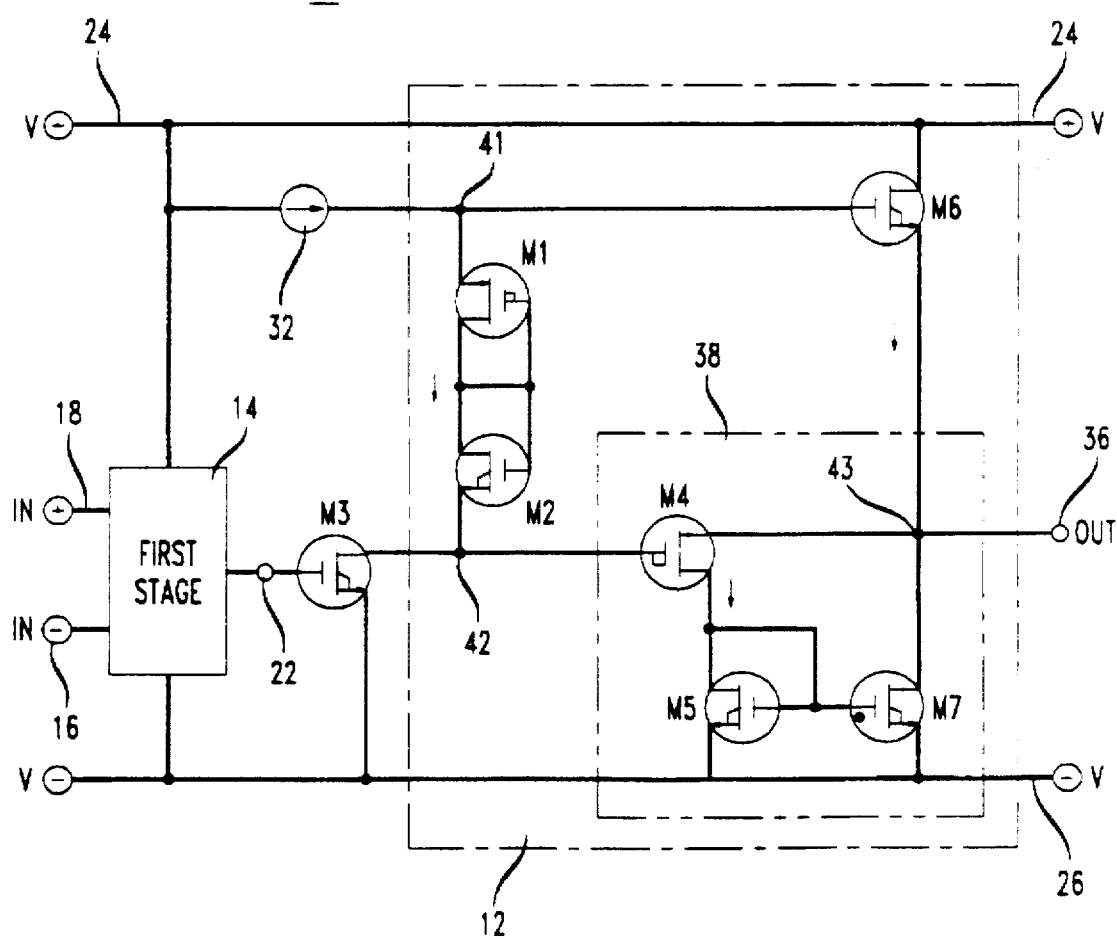
FIG. 2 is a schematic diagram of a conventional MOS operational amplifier output stage.

The size advantage associated with the MOS version of this embodiment differs from the bipolar version because, for high voltage MOS devices, the physical size of most ×100 devices is only about 50 times larger than that of a ×1 device. Still, the embodiment shown in FIG. 4 replaces the control transistors M1 (×100) and M2 (×100) of FIG. 2 with M1 (×1), M2 (×1), M8 (×1), M9 (×1) and M10 (×100). It is reasonable to assume that high voltage P- and N-channel transistors have similar sizes and size relationships. In addition, the low voltage P-channel IGFETs M8 (×1) and M10 (×100) combined are only approximately the same physical size as a single ×1 high voltage MOS transistor. Thus, the overall control transistor size (i.e., M1 and M2 in FIG. 2) has been reduced from ×200 (×100+×100) to approximately ×4 (×1+×1+×1+×1), which is a size savings of approximately 98%.

In this arrangement, high voltage IGFETs M1 and M4, low voltage IGFETs M8 and M10 and DMOSs M2, M9 and M6 must be of the same type and structure for similar temperature performances and for the operational amplifier quiescent current to be independent of temperature and manufacturing variations.

Figure 5:
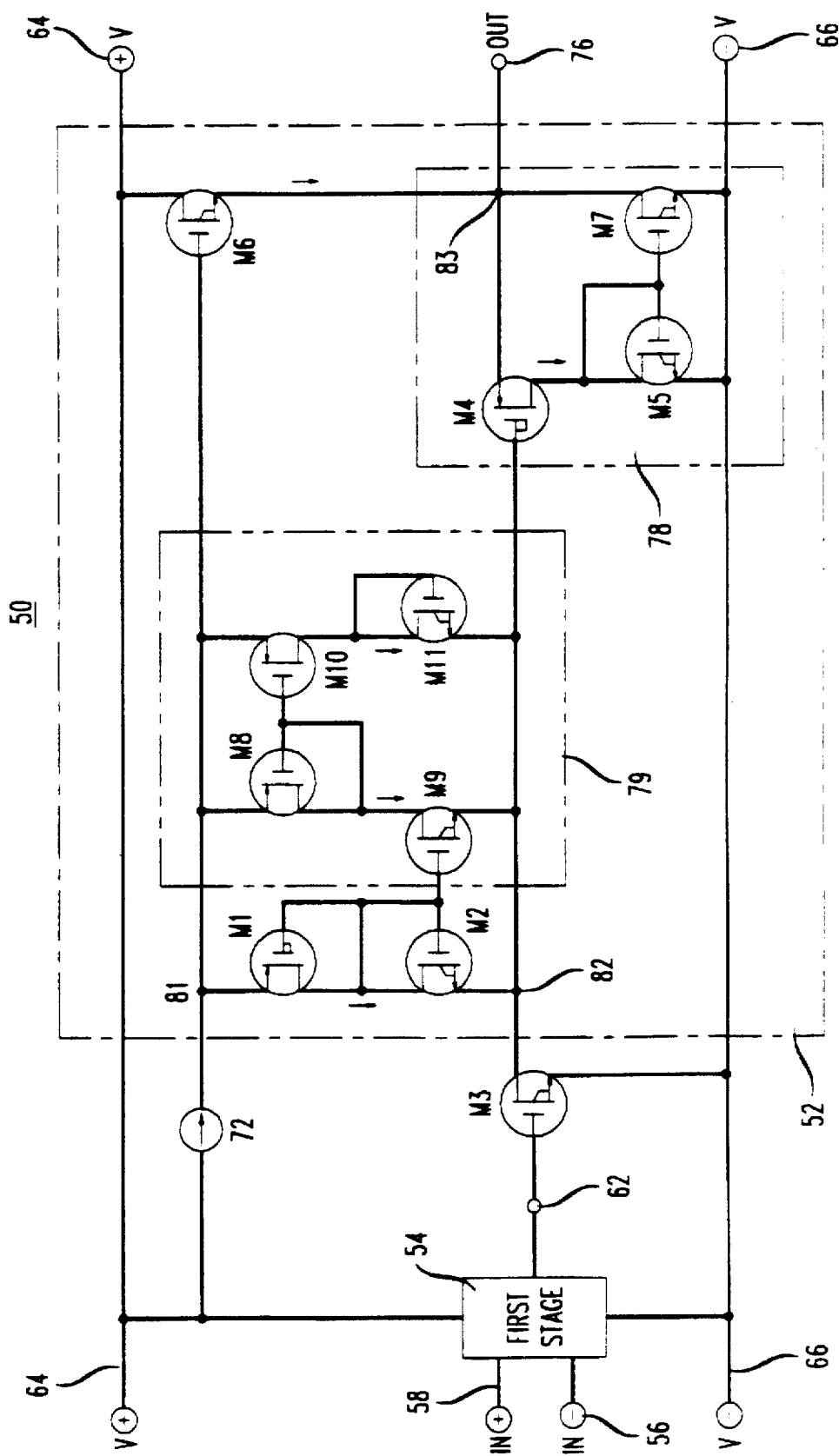
FIG. 5 is a schematic diagram of the MOS operational amplifier output stage of FIG. 4 showing an alternative embodiment.

One of the few limitations in this particular MOS arrangement is the Early current effect, which is known to those skilled in the art. To correct the Early effect, a diode-connected DMOS transistor M11 is connected between the drain of IGFET M10 and node 82, as shown in FIG. 5.

It will be apparent to those skilled in the art that many changes and substitutions can be made to the operational amplifier output circuitry arrangements herein described without departing from the spirit and scope of the invention as defined by the appended claims.

What is claimed is:

1. An integrated circuit having an amplifier with an output stage, said output stage for use with a constant current source, said output stage comprising:

an output side having at least one drive transistor; and
a quiescent current control side through which substantially all of the current from said constant current source flows, said quiescent current control side operably connected to said output side in such a way that causes a quiescent current flowing through said output side to be maintained at a value that is substantially proportional to the current that flows through said quiescent current control side, said quiescent current control side having
a quiescent current control section including at least one control transistor, said quiescent current control section connected to said output side in such a way as to maintain quiescent current within said output stage at said value notwithstanding changes in temperature, and a current diverter operably connected to said quiescent current control section that alters current flow through said quiescent current control section in such a way that allows said quiescent current control side to be fabricated with transistors having characteristic sizes that are substantially smaller than the characteristic size of said at least one output side drive transistor, said current diverter including a first current diverter branch having a first amplifying transistor, said first branch operably coupled to said control transistor in such a way that causes at least a portion of the current flowing from said constant current source to flow through said first branch in such a way that the amount of current flowing through said first branch as compared to that flowing through said control transistor is related to the characteristic size of said first amplifying transistor as compared to the characteristic size of said control transistor, and a second current diverter branch having a second amplifying transistor, said second branch operably coupled to said first branch in such a way that causes at least a portion of the current flowing from said constant current source to flow through said second branch in such a way that the amount of current flowing through said second branch is related to the characteristic size of said second amplifying transistor.

2. The circuit as recited in claim 1, wherein said current diverter is operably connected to said quiescent current control side in such a way that reduces current flow through said control section to allow said control section to be fabricated with transistors having characteristic sizes approximately 1 to 2 orders of magnitude smaller than the characteristic size of said at least one output side drive transistor.

3. The circuit as recited in claim 1, wherein said control section includes at least one diode-connected control transistor, and wherein said current diverter further comprises:

a first amplifying transistor operably connected to said diode-connected control transistor in such a way that forms a first current mirror arrangement;

a second diode-connected transistor operably connected to said first amplifying transistor, said first amplifying transistor and said second diode-connected transistor forming a first current diverter branch; and a second amplifying transistor operably connected to said second diode-connected transistor in such a way that forms a second current mirror arrangement operably coupled to said first current mirror arrangement, said second amplifying transistor forming a second current diverter branch, said first current mirror arrangement causing at least a portion of the current flowing from said constant current source to flow through said first current diverter branch in such a way that the amount of current flowing through said first current diverter branch as compared to that flowing through said diode-connected control transistor is proportional to the characteristic size of said first amplifying transistor as compared to the characteristic size of said diode-connected control transistor, said second current mirror arrangement causing at least a portion of the current flowing from said constant current source to flow through said second current diverter branch in such a way that the amount of current flowing through said second current diverter branch as compared to that flowing through said first current diverter branch is proportional to the characteristic size of said second amplifying transistor as compared to the characteristic size of said second diode-connected transistor.

4. An integrated circuit having an amplifier, said amplifier for use with a positive source voltage and a negative source voltage, said amplifier comprising:

a first stage having a noninverting input, an inverting input, an output and a constant current source, said first stage connected between said positive and negative source voltages; and an output stage having an output side having a positive output drive transistor connected to said positive source voltage and a negative output drive transistor connected to said negative source voltage, a quiescent current control side through which substantially all of the current from said constant current source flows, said quiescent current control side operably connected to said output side in such a way that causes a quiescent current flowing through said output side to be maintained at a value that is substantially proportional to the current that flows through said quiescent current control side, said quiescent current control side having a pair of diode-connected control transistors and a current diverter, said diode-connected control transistors being operably connected to said output side in such a way that maintains quiescent current within said output stage at said value notwithstanding changes in temperature, and said current diverter being operably connected to said diode-connected control transistors and said output side to alter current flow from said constant current source through said diode-connected control transistors in such a way that allows said diode-connected control transistors to have characteristic sizes that are substantially smaller than the characteristic sizes of said output side drive transistors.

5. The circuit as recited in claim 4, wherein said diode-connected control transistors have characteristic sizes that are approximately 1 to 2 orders of magnitude smaller than the characteristic sizes of said output side drive transistors.

6. The circuit as recited in claim 4, wherein at least one of said control transistors has a characteristic size and wherein said current diverter further comprises an amplifying transistor having a characteristic size and operably coupled to at least one of said diode-connected control transistors in such a way that causes the current flowing through said current diverter as compared to that flowing through said diode-connected control transistors to be proportional to the characteristic size of said amplifying transistor as compared to the characteristic size of one of said control transistors.

7. The circuit as recited in claim 4, wherein said positive and negative output drive transistors are connected to said quiescent current control side via a first and second node, respectively, wherein said diode-connected control transistors are operably connected between said first and second nodes, and wherein said current diverter further comprises:

a first amplifying transistor operably connected to said diode-connected control transistors in such a way that forms a first current mirror arrangement;

a diode-connected transistor operably connected to said first amplifying transistor, said first amplifying transistor and said diode-connected transistor forming a first current diverter branch between said first and second nodes; and a second amplifying transistor operably connected to said diode-connected transistor in such a way that forms a second current mirror arrangement operably coupled to said first current mirror arrangement, said second amplifying transistor forming a second current diverter branch between said first and second nodes, said first current mirror arrangement causing at least a portion of the current flowing from said constant current source to flow through said first current diverter branch in such a way that the amount of current flowing through said first current diverter branch as compared to that flowing through said diode-connected control transistors is proportional to the characteristic size of said first amplifying transistor as compared to the characteristic size of one of said diode-connected control transistors, said second current mirror arrangement causing at least a portion of the current flowing from said constant current source to flow through said second current diverter branch in such a way that the amount of current flowing through said second current diverter branch as compared to that flowing through said first current diverter branch is proportional to the characteristic size of said second amplifying transistor as compared to the characteristic size of said diode-connected transistor.

8. The circuit as recited in claim 7, wherein the characteristic size of said first amplifying transistor is greater than that of either of said diode-connected control transistors.

9. The circuit as recited in claim 7, wherein the characteristic size of said second amplifying transistor is greater than that of said diode-connected transistor.

10. The circuit as recited in claim 4, wherein said positive and negative output drive transistors are connected to said quiescent current control side via a first and second node, respectively, wherein said diode-connected control transistors are operably connected between said first and second nodes, and wherein said current diverter further comprises:

a first amplifying bipolar transistor whose base is operably connected to at least one of said diode-connected control transistors in such a way that forms a first current mirror arrangement therewith;

a diode-connected bipolar transistor whose base and collector operably connect to the collector of said first amplifying transistor, said first amplifying transistor and said diode-connected transistor forming a first current diverter branch between said first and second nodes; and a second amplifying bipolar transistor whose base operably connects to the base and collector of said diode-connected bipolar transistor in such a way that forms a second current mirror arrangement that is operably coupled to said first mirror arrangement, said second amplifying transistor forming a second current diverter branch between said first and second nodes, said first current mirror arrangement causing at least a portion of the current flowing from said constant current source to flow through said first current diverter branch in such a way that the amount of current flowing through said first current diverter branch as compared to that flowing through said diode-connected control transistors is proportional to the characteristic size of said first amplifying transistor as compared to the characteristic size of one of said diode-connected transistors, said second current mirror arrangement causing at least a portion of the current flowing from said constant current source to flow through said second current diverter branch in such a way that the amount of current flowing through said second current diverter branch as compared to that flowing through said first current diverter branch is proportional to the characteristic size of said second amplifying transistor as compared to the characteristic size of said diode-connected transistor.

11. The circuit as recited in claim 4, wherein said positive and negative output drive transistors are connected to said quiescent current control side via a first and second node, respectively, wherein said diode-connected control transistors further comprise MOS transistors operably connected between said first and second nodes, and wherein said current diverter further comprises:

a first amplifying MOS transistor whose gate is operably connected to at least one of said diode-connected control MOS transistors in such a way that forms a first current mirror arrangement therewith;

a diode-connected MOS transistor whose gate and drain operably connect to the drain of said first amplifying transistor, said first amplifying MOS transistor and said diode-connected MOS transistor forming a first current diverter branch between said first and second nodes; and a second amplifying MOS transistor whose gate operably connects to the gate and drain of said diode-connected MOS transistor in such a way that forms a second current mirror arrangement that is operably coupled to said first current mirror arrangement, said second amplifying MOS transistor forming a second current diverter branch between said first and second nodes, said first current mirror arrangement causing at least a portion of the current flowing from said constant current source to flow through said first current diverter branch in such a way that the current flowing through said first current diverter branch as compared to that flowing through said diode-connected control MOS transistors is proportional to the channel width factor of said first amplifying MOS transistor as compared to the channel width factor of one of said diode-connected control MOS transistors, said second current mirror arrangement causing at least a portion of the current flowing from said constant current source to flow through said second current diverter branch in such a way that the current flowing through said second current diverter branch as compared to that flowing through said first current diverter branch is proportional to the channel width factor of said second amplifying MOS transistor as compared to the channel width factor of said diode-connected MOS transistor.

12. The circuit as recited in claim 11, wherein said amplifier further comprises a second diode-connected MOS transistor operably connected to said second amplifying MOS transistor in such a way that the drain to source voltages for said diode-connected MOS transistor and said second amplifying transistor are approximately equal.

13. The circuit as recited in claim 4, wherein said positive and negative output drive transistors are connected to said quiescent current control side via a first and second node, respectively, wherein said pair of diode-connected quiescent current control transistors further comprise a pair of bipolar transistors connected between said first and second nodes so that their bases and collectors are commonly connected, and wherein said current diverter operably connects to the commonly connected bases and collectors of said first and second diode-connected bipolar transistors and between said first and second nodes.

14. The circuit as recited in claim 4, wherein said positive and negative output drive transistors are connected to said quiescent current control side via a first and second node, respectively, wherein said pair of diode-connected quiescent current control transistors further comprise a pair of MOS transistors connected between said first and second nodes so that their gates and drains are commonly connected, and wherein said current diverter operably connects to the commonly connected gates and drains of said first and second diode-connected MOS transistors and between said first and second nodes.

* * * * *